United States Patent [19]

Heck

[11] Patent Number: 4,573,210

[45] Date of Patent: Feb. 25, 1986

[54] NULL INITIATED METHOD AND SYSTEM FOR MONITORING A PRIORITY CHANNEL

[75] Inventor: Joseph P. Heck, Ft. Worth, Tex.

[73] Assignee: Motorola, Inc., Schaumburg, Ill.

[21] Appl. No.: 565,948

[22] Filed: Dec. 27, 1983

[51] Int. Cl.⁴ .............................................. H03J 7/20
[52] U.S. Cl. ................................................. 455/166
[58] Field of Search ................ 455/161, 166, 168, 169

[56] References Cited

U.S. PATENT DOCUMENTS

| | | | |
|---|---|---|---|
| 3,470,481 | 9/1969 | Myers | 455/166 |
| 3,497,813 | 2/1970 | Gallagher | 455/166 |
| 3,531,724 | 9/1970 | Fathauer . | |
| 3,614,621 | 10/1971 | Chapman et al. . | |
| 3,617,895 | 11/1971 | Tomsa et al. . | |
| 3,619,788 | 11/1971 | Giles, Jr. | 455/166 |
| 3,750,032 | 7/1973 | Andrews . | |
| 3,821,651 | 6/1974 | Fathauer et al. . | |
| 4,190,803 | 2/1980 | Imamura | 455/166 |
| 4,253,194 | 2/1981 | Van Deursen . | |
| 4,498,194 | 2/1985 | Vandegraaf | 455/166 |

Primary Examiner—Jin F. Ng
Attorney, Agent, or Firm—Donald B. Southard; Ed Roney

[57] ABSTRACT

A null initiated priority channel monitoring system provides enhanced nonpriority signal intelligibility and/or enhanced priority channel sensitivity during sample times. The priority channel or channels are monitored during nulls in the received nonpriority signal. The system can have a minimum time period between priority channel monitoring periods to avoid substantially continuous priority channel monitoring. The system can also have a maximum time period between priority channel monitoring or sampling periods to avoid missing any priority channel signal.

22 Claims, 3 Drawing Figures

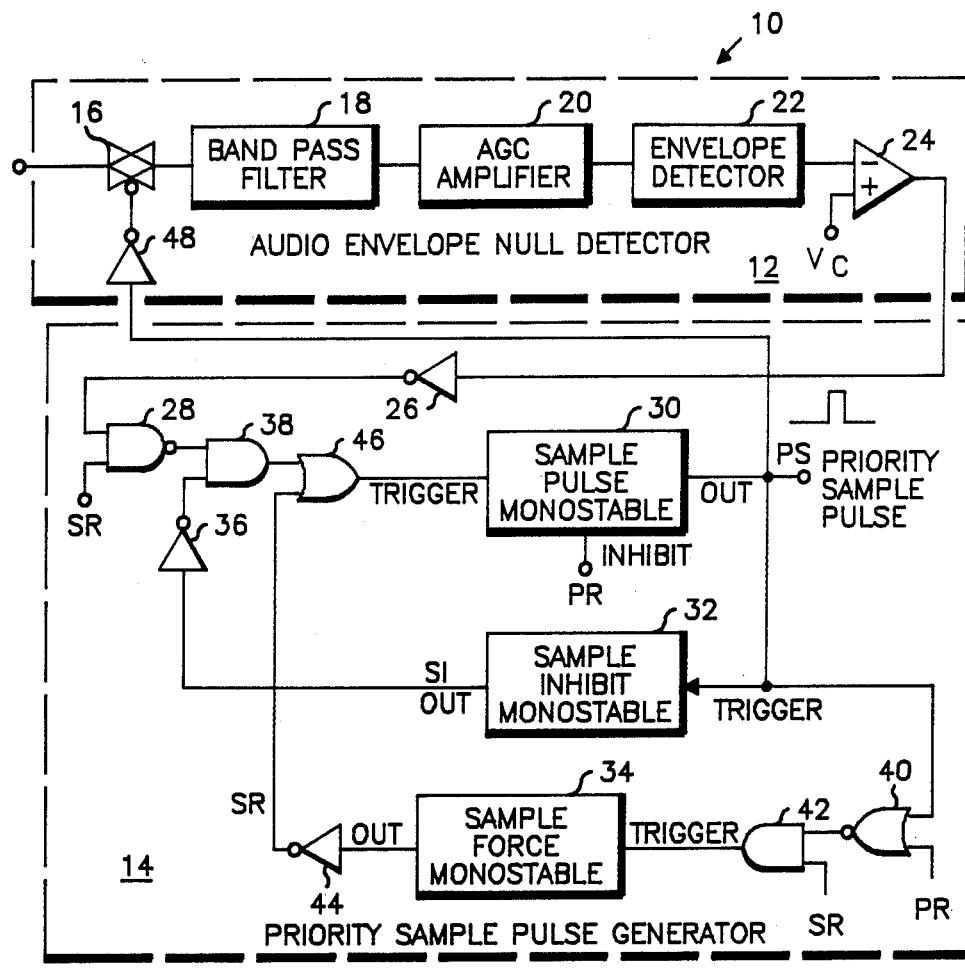
Fig. 1
Fig. 2
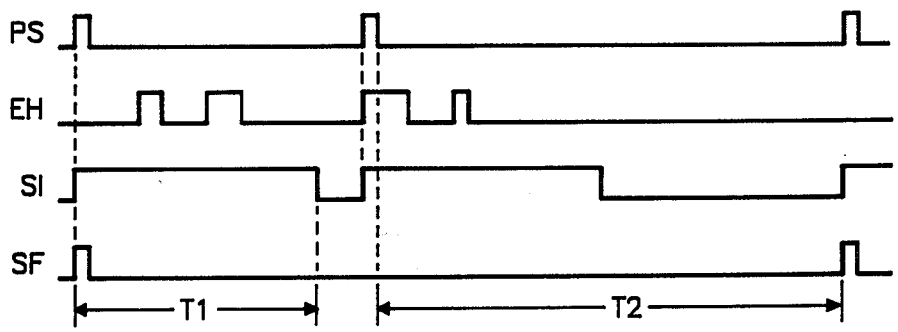

NULL INITIATED METHOD AND SYSTEM FOR MONITORING A PRIORITY CHANNEL

BACKGROUND OF THE INVENTION

Multifrequency receivers generally have an automatic switching system for selecting tuning elements to provide for signal reception on any one of a plurality of different channels. The channels can be selected automatically to selectively connect the different tuning elements or circuits in the receiver to each channel until a carrier wave or signal is detected on a channel. The receiver then terminates the channel scanning or selecting until the signal terminates, when the channel scanning will be resumed.

It often is desirable to assign a priority to one or more of the channels and to receive the signal on the highest priority channel whenever a signal is being received on the priority channel. One such system is disclosed in U.S. Pat. No. 3,614,621, which is assigned to the present assignee. In a typical priority channel system, the priority channel or channels are continually sampled for signals during the reception of signals on any of the other nonpriority or lower priority channels. Whenever a priority signal is detected, only the priority signal is received until the priority signal terminates.

In a priority signal system, the length of time that each channel is sampled when no signals are detected should be relatively short to permit the rapid scanning of all the channels for a received signal. If a signal is detected on a nonpriority channel, the system will remain tuned to the nonpriority channel for the major portion of time the signal is received and sample the priority channel or channels periodically. When a signal is detected during the sample period, the system will remain tuned to the priority channel until the signal terminates. When all signals terminate, the system will again scan all the channels until the next signal is detected.

The sample time or period is of sufficient length to detect the presence of a signal on the priority channel, but is short enough to prevent the production of a substantial audible hole in the signal being received on the nonpriority channel. The priority sample periods are generally taken at fixed intervals, such as four times a second. The sample periods are typically of 10 to 20 milliseconds in length. The sample periods do not cause a substantial audible signal hole in the nonpriority signal; however, the signal is muted during the sample period which can cause both annoyance to the listener and some loss of signal intelligibility.

It is therefore a general object of the present invention to provide an improved priority channel monitoring method and system which provides a minimal signal loss on the nonpriority channels.

It is a further object of the present invention to provide the minimal signal loss by sampling the priority channel during nulls in the received nonpriority detected audio signal.

It also is an object of the present invention to provide an enhanced priority channel sensitivity, by allowing longer sample length times without further degrading the nonpriority signal intelligibility.

It is another object of the present invention to set a minimum time period between priority sampling periods to avoid substantially continuous priority channel sampling.

It is an additional object of the present invention to set a maximum time period between priority sampling periods to avoid signal loss on the priority channel.

SUMMARY OF THE INVENTION

The invention provides a method of monitoring one or more priority channels with a minimal nonpriority signal loss in a multichannel radio receiver. The method includes receiving a nonpriority signal, detecting nulls in the nonpriority detected audio signal and sampling the priority channel for a time period for a received signal during the nulls to avoid disruptions in the nonpriority signal.

The invention further provides a system for monitoring one or more priority channels with a minimal nonpriority signal loss in a multichannel radio receiver. The system includes means for receiving a nonpriority signal, means for detecting nulls in the nonpriority detected audio signal and means for sampling the priority channel for a time period for a received signal during the nulls to avoid disruptions in the nonpriority signal.

BRIEF DESCRIPTION OF THE DRAWINGS

The features of the present invention which are believed to be novel are set forth with particularity in the appended claims. The invention, together with further objects and advantages thereof, can be best understood by making reference to the following description taken in conjunction with the accompanying drawings, in the several figures of which like reference numerals identify identical elements, and wherein:

FIG. 1 is a block diagram of the system embodying the present invention;

FIG. 2 is a timing diagram of the logic transactions of the system of FIG. 1.

DESCRIPTION OF THE PREFERRED EMBODIMENTS

Figure 3:
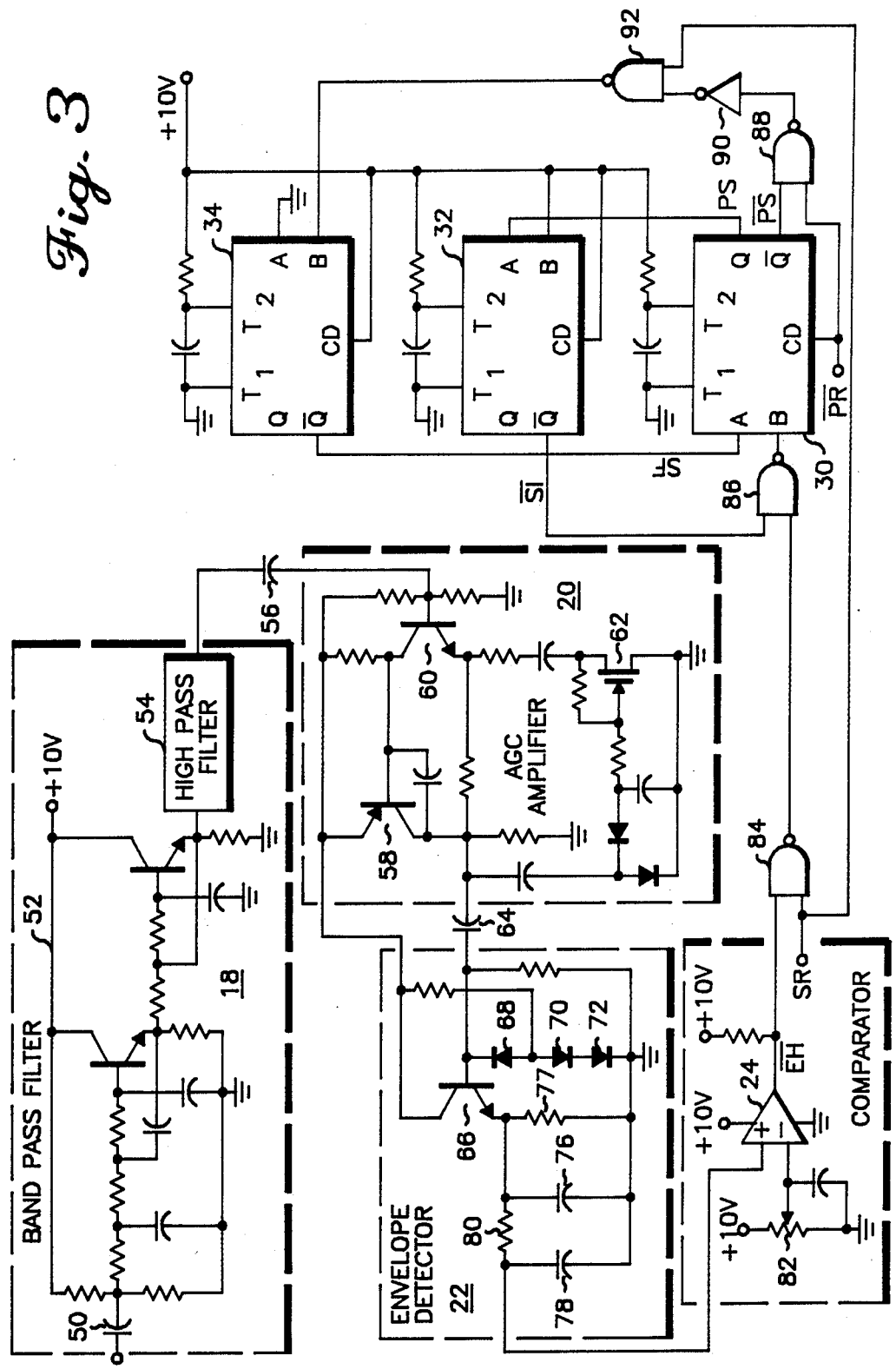
FIG. 3 is a schematic diagram of one embodiment of a logic circuit of the system of FIG. 1.

Referring now to FIG. 1, a null initiated priority channel monitoring system 10, embodying the present invention is illustrated. The system includes an audio envelope null detector 12 and a priority sample pulse generator 14. The null detector 12 includes a muting switch 16 which couples a de-emphasized recovered audio signal from the antenna (not illustrated) to a band pass filter 18. The muting switch 16 prevents a large amplitude noise burst from being coupled to the detector 12 when a priority channel is sampled which does not have a signal present on the channel.

The band pass filter 18 optimizes the response of the detector 12 to voice frequencies and prevents desensitization of the detector from high or low frequency noise or phase lock/digital phase lock modulation. Both the muting switch 16 and the band pass filter 18, generally are part of the receiver and are not additional elements in the detector 12.

An automatic gain control (AGC) amplifier 20 receives the filtered signal from the filter 18. The AGC amplifier 20 generates a substantially constant peak amplitude signal which is coupled to an envelope detector 22. The AGC amplifier 20 eliminates the long-term loudness variations in normal speech and other signal fluctuations so that a consistent relative null can be detected. The envelope detector 22 generates a dc signal which is proportional to the amplitude of the audio input. The dc signal is coupled to one input of a comparator 24. The second input of the comparator 24 is a control voltage $V_c$, which is selected to be a fixed percentage of the peak envelope amplitude.

The optimum voltage $V_c$ is determined by the signal-to-voice ratio or degree of signal quieting of the signal coupled to the comparator 24 and upon the time constant of the envelope detector 22. The voltage $V_c$ can be adjusted by the output of any relative signal strength indicator, such as the long squelch tail (weak signal) indicator of a conventional squelch circuit. The relative signal strength adjustment allows $V_c$ to be adjusted upwards for weak received signals so that the nulls can be detected. If $V_c$ is not adjusted, the noise level of the weak signal can cause the output of the envelope detector 22 to stay too high for the comparator 24 to trip.

When the comparator 24 senses a null and trips; it couples a high (1) signal indicative of the envelope hole (EH) to the generator 14 through an inverter 26 to one input of a NAND gate 28. The signal timing logic is best illustrated in FIG. 2 and the particular circuit elements illustrated are only one embodiment incorporating the invention. The generator 14 can also be implemented in a microprocessor embodiment. The second input of the gate 28 is a high signal SR when a signal is received on the priority or the nonpriority channel. Preferably, the signal SR remains high for a fixed delay period, such as 200 milliseconds after the signal terminates. The signal SR remains high so that a premature departure from an active channel, priority or nonpriority, is prevented during signal fades or during the priority channel sample periods.

The signal PR for priority signal received is high when a signal is detected on the priority channel. The signal PS is generated by a priority sample generator 30. The high signal PS enables the priority channel frequency and disables the active nonpriority frequency during the priority sample time. The signal SI is generated by a sample inhibit generator 32. The high signal SI inhibits a priority sample from being generated by a high signal EH for a preselected time period T1 after PS goes high. T1 is the minimum time period between priority sample periods which ensures that continuous or nearly continuous priority samples are not taken.

The signal SF is generated by a sample force generator 34. The high signal SF forces a priority sample to be taken if a high EH signal has not occurred during a preselected time period T2. T2 is the maximum time period between priority sample periods, which ensures that a priority sample occurs at least on some maximum interval.

The operation of the generator 14 is best understood with reference to FIGS. 1 and 2. Assume that a signal is being received on a nonpriority channel, so that SR is high and PR is low. Also assume that a priority sample is just taking place. On the leading edge of the sample pulse signal PS, the sample inhibit generator 32 will trigger to cause SI to go high for the time period T1. SI is coupled through an inverter 36 as a low signal to one input of an AND gate 38. The output of gate 38 therefore remains low for the time period T1 without regard to whether a null signal EH occurs or not, which inhibits another PS signal during T1.

At the falling edge of the sample pulse signal PS, the sample force generator 34 will trigger if PR remains low. The signal PS is one input of a NOR gate 40 which will generate a high signal to an AND gate 42 when both PS and PR are low. The gate 42 will generate a high signal to trigger the generator 34 if SR remains high.

If a null signal EH is received during the time period T2, the generator 34 will retrigger, PS will go high and generator 32 again generates the signal SI for the time period T1. If a null signal EH is not received, following the period T1, but before the end of the period T2, the signal SF is generated through an inverter 44 and an OR gate 46. The output of the OR gate 46 will go high to trigger the generator 30, when either the signal SF is generated, or the null signal EH is generated after SI is terminated. Each of the logic combinations is indicated in FIG. 2.

The reception of a signal by the detector 12 is inhibited during the signal PS, by coupling the signal through an inverter 48 to the switch 16. The switch 16 mutes the noise on the priority channel (if any) until the priority sample period is terminated. When SR is low, neither a priority or nonpriority signal is being received and the gates 28 and 42 will be inhibited, preventing any sample pulse from being generated. The generator 30 also is inhibited from generating a sample pulse by the signal PR when a priority signal is received. Since nulls in a normal signal pattern occur frequently, the system 10 can monitor the priority channel for a much larger portion of the time without disrupting the nonpriority signal.

Referring to FIG. 3, one schematic logic embodiment of the invention is illustrated. The signal from the muting switch 16 is coupled through a capacitor 50 into the band pass filter 18 which includes a first conventional third order low pass 3 kHz Butterworth filter 52.

The filter 18 also can include a second third order high pass 300 Hz filter 54. The signal output of the filter 18 is coupled through a capacitor 56 into the AGC amplifier 20. The filter 18 is generally part of the receiver as above mentioned. The filter 18 also can be eliminated and the invention will still be operable although it will not function as well for noisy or weak signals.

The AGC amplifier 20 includes a pnp transistor 58 which provides an essentially constant peak to peak signal output on its collector. The AGC amplifier 20 is designed for about a 30 db range over which the output signal remain constant. The range of course depends upon the receiver design and application. As designed, the signal from the filter 18 is fed first to a npn transistor 60, which is also coupled to a JFET 62. The signal output of the transistor 58 is coupled through a capacitor 64 to the envelope detector 22.

The signal from the amplifier 20 is fed to the base of an npn transistor 66. Three diodes 68, 70 and 72 and a resistor 74 provide a bias circuit for the transistor 66, which maintains the transistor 66 at just below its turn on amplitude. The transistor 66 will follow any positive signal from the amplifier 20 and will store the signal peak from its emitter on a capacitor 76. The value of the capacitor 76 and a resistor 77 sets the decay time constant of the detector 22. A capacitor 78 and a resistor 80 provide a further filter for the dc output signal from the detector 22.

The detector 22 provides a slowly varying dc output signal to one input of the comparator 24. A voltage divider 82 is set to provide the desired $V_c$ to the second input of the comparator 24. If a weak signal indicating circuit is utilized to vary $V_c$, then the voltage divider 82 would be replaced by the input from the weak signal circuit, such as the above mentioned squelch circuit.

The output signal of the comparator 24 is an inverted null signal $\overline{EH}$.

The null signal $\overline{EH}$ is coupled to the first input of a pair of NAND gates 84 and 86 and through the gates to one input of the priority sample generator 30. The signal PS is coupled from one output of the generator or monostable multivibrator 30 to one input of the sample inhibit generator or monostable multivibrator 32. The output signal $\overline{SI}$ from the generator 32 is coupled to the second input of the gate 86.

A second signal $\overline{PS}$ from the generator 30 is coupled to one input of a NAND gate 88. The inhibit signal $\overline{PR}$ is coupled to the clear terminal of the generator 30 and to the second input of the gate 88. The output of the gate 88 is fed through an inverter 90 to one input of a NAND gate 92. The SR signal is coupled to the second input of the gates 84 and 92. The output of the gate 92 is coupled to an input of the sample force generator or monostable multivibrator 34. The SF signal output of the generator 34 is coupled to a second input of the generator 30. The A input of the multivibrators 30, 32 and 34 is positive edge triggered and the B input is negative edge triggered. The operation of the circuit of FIG. 3 is identical to that referred to above with respect to FIGS. 1 and 2.

The present invention therefore provides an improved system and method of monitoring one or more priority channels with minimal disruption in a nonpriorory received signal. Because the priority channel or channels are monitored during nulls in the nonpriority detected audio signal, the priority channel monitoring time can be increased to enhance the priority channel signal sensitivity without degrading the nonpriority signal. This can be even more important in a multichannel receiver which has two priority channels, which then can be sequentially sampled during one priority sample period.

What is claimed is:

1. A method of monitoring one or more priority channels with minimal signal loss on nonpriority channels in a multichannel radio receiver, comprising:
receiving a demodulated audio signal on a nonpriority channel;
detecting nulls in said received demodulated audio signal; and
sampling the priority channel for a priority sampling period for a received signal during each of said null to avoid disruption in said nonpriority received signal.

2. The method as defined in claim 1, including:
setting a minimum time period between said priority sampling periods.

3. The method as defined in claim 1, including:
setting a maximum time period between said priority sampling periods.

4. The method as defined in claim 1, including:
receiving only said priority signal when a priority signal is detected during said priority sampling period.

5. The method as defined in claim 4, including:
returning to receive said nonpriority signal when said priority signal terminates.

6. The method as defined in claim 5, including:
pausing for a predetermined delay period when said priority signal terminates before returning to receive said nonpriority signal.

7. The method as defined in claim 5, including:
scanning the priority and nonpriority channels sequentially when both said priority and said nonpriority signals have terminated.

8. The method as defined in claim 7, including:
pausing for a predetermined delay period when said nonpriority signal terminates before scanning said channels.

9. The method as defined in claim 1, including:
sequentially sampling at least a pair of priority channels during said priority sampling period.

10. The method as defined in claim 1, including:
developing a relative audio null signal and comparing it to a predetermined null signal level to detect said nulls.

11. The method as defined in claim 10, including:
varying said predetermined null signal level as a function of the amplitude of said nonpriority received signal.

12. A system of monitoring one or more priority channels with minimal signal loss on nonpriority channels in a multichannel radio receiver, comprising:
means for receiving a demodulated audio signal on a nonpriority channel;
means for detecting nulls in said received demodulated audio signal; and
means for sampling the priority channel for a priority sampling period for a received signal during each of said null to avoid disruption in said nonpriority received signal.

13. The system as defined in claim 12, including:
means for setting a minimum time period between said priority sampling periods.

14. The system as defined in claim 12, including:
means for setting a maximum time period between said priority sampling periods.

15. The system as defined in claim 12, including:
means for receiving only said priority signal when a priority signal is detected during said priority sampling period.

16. The system as defined in claim 15, including:
means for returning to receive said nonpriority signal when said priority signal terminates.

17. The system as defined in claim 16, including:
means for pausing for a predetermined delay period when said priority signal terminates before returning to receive said nonpriority signal.

18. The system as defined in claim 16, including:
means for scanning the priority and nonpriority channels sequentially when both said priority and said nonpriority signals have terminated.

19. The system as defined in claim 18, including:
means for pausing for a predetermined delay period when said nonpriority signal terminates before scanning said channels.

20. The system as defined in claim 12, including:
means for sequentially sampling at least a pair of priority channels during said priority sampling period.

21. The system as defined in claim 12, including:
means for developing a relative audio null signal and means for comparing it to a predetermined null signal level to detect said nulls.

22. The system as defined in claim 21, including:
means for varying said predetermined null signal level as a function of the amplitude of said nonpriority received signal.

* * * * *